United States Patent
Theil et al.

[11] Patent Number: 6,114,739
[45] Date of Patent: Sep. 5, 2000

[54] ELEVATED PIN DIODE ACTIVE PIXEL SENSOR WHICH INCLUDES A PATTERNED DOPED SEMICONDUCTOR ELECTRODE

[75] Inventors: Jeremy A. Theil; Min Cao, both of Mountain View; Dietrich W. Vook, Menlo Park; Frederick A. Perner, Palo Alto; Xin Sun, San Jose; Shawming Ma, Sunnyvale; Gary W. Ray, Mountain View; Wayne M. Greene, Los Gatos; Kit M. Cham, Cupertino; Steven A. Lupi, Gilroy, all of Calif.

[73] Assignee: Agilent Technologies, Palo Alto, Calif.

[21] Appl. No.: 09/174,717

[22] Filed: Oct. 19, 1998

[51] Int. Cl.[7] .............................. H01L 27/14; H01L 31/00
[52] U.S. Cl. ......................... 257/458; 257/448; 257/185
[58] Field of Search ................................... 257/458, 448, 257/185

[56] References Cited

U.S. PATENT DOCUMENTS

| | | |
|---|---|---|
| 4,342,044 | 7/1982 | Ovshinsky et al. . |
| 4,571,626 | 2/1986 | Yamada . |
| 4,847,210 | 7/1989 | Hwang et al. . |
| 4,866,499 | 9/1989 | Aktik . |
| 5,213,984 | 5/1993 | Okada et al. ............... 437/2 |
| 5,227,656 | 7/1993 | Timlin et al. . |
| 5,481,124 | 1/1996 | Kozuka et al. . |
| 6,018,187 | 1/2000 | Theil et al. . |

FOREIGN PATENT DOCUMENTS 0 494 694  1/1992  European Pat. Off. ...... H01L 27/146

OTHER PUBLICATIONS

Silicon Vision GmbH—TFA Technology—a–Si:H Photodetectors, pp. 1–6, GIF image 761×413 pixels; Thin Film Technology pp. 1–2, GIF image 901×457 pixels; Archive–Index, p. 1.

Q. Zhu, T. Lule, H. Stiebig, T. Martin, J. Giehl, J. Zhou, H. Fisher, M. Bohm—Universitat–GH Siegen, Institut fur Halbleiterelektronik (IHE), D–57068, Siegen, Germany; pp. 727–729.

*Primary Examiner*—Stephen D. Meier
*Attorney, Agent, or Firm*—Brian Short

[57] ABSTRACT

An active pixel sensor. The active pixel sensor includes a substrate, an interconnect structure adjacent to the substrate, and at least one photo sensor adjacent to the interconnect structure. At least one photo sensor is formed adjacent to the interconnect structure. Each photo sensor includes a pixel electrode which includes a patterned doped semiconductor layer. An I-layer is formed adjacent to the patterned doped semiconductor layer. A transparent electrode is formed adjacent to the I-layer. A method of forming the active pixel sensor includes forming an interconnect structure over a substrate. Next, a doped semiconductor layer is deposited over the interconnect structure. The doped semiconductor layer is etched forming pixel electrode. An I-layer is deposited over the pixel electrodes. Finally, a transparent conductive layer is deposited over the I-layer.

11 Claims, 4 Drawing Sheets ature are very small pixel sensor. The second embodiment includes a pat-
ELEVATED PIN DIODE ACTIVE PIXEL SENSOR WHICH INCLUDES A PATTERNED DOPED SEMICONDUCTOR ELECTRODE

FIELD OF INVENTION

This invention relates generally to PIN photo diode active pixel sensors. In particular, it relates to an elevated PIN diode sensor which includes a patterned doped semiconductor electrode.

BACKGROUND

An array of image sensors or light sensitive sensors detect the intensity of light received by the image sensors. The image sensors typically generate electronic signals that have amplitudes that are proportionate to the intensity of the light received by the image sensors. The image sensors can convert an optical image into a set of electronic signals. The electronic signals may represent intensities of colors of light received by the image sensors. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allows electronic imaging systems to be low cost, compact and require low power consumption.

Historically, image sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems.

An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

FIG. 1 shows a cross-section of a prior art array of image sensors. This array of image sensors includes PIN diode sensors located over a substrate 10. An interconnection structure 12 electrically connects an N-layer 14 of the PIN diodes to the substrate 10. An I-layer 16 is formed over the N-layer 14. A P-layer 18 is formed over the I-layer 16. The P-layer 18, the I-layer 16 and the N-layer 14 form the array of PIN diode sensors. A first conductive via 20 electrically connects a first diode sensor to the substrate 10, and a second conductive via 22 electrically connects a second diode sensor to the substrate 10. A translucent conductive layer 24 is located over the array of diode sensors.

A limitation of the image sensor structure of FIG. 1 is that the individual image sensors are not isolated from each other. That is, light received by a given image sensor will effect neighboring image sensors because current can flow through the N-layer 14 between neighboring image sensors. The P-layer 18, the I-layer 16 and the N-layer 14 are shared by neighboring image sensors. A trench 28 is formed to provide some isolation between the image sensors by increasing the resistance between the N-layers of neighboring image sensors.

It is desirable to have an array of image sensor in which each image sensor includes a separate N-layer. The N-layer of each image sensor being physically separated from the N-layer of neighboring sensors.

SUMMARY OF THE INVENTION

The present invention is an elevated active pixel sensor formed adjacent to a substrate which includes a plurality of photo sensors in which each photo sensor includes a separate patterned doped semiconductor layer. The patterned doped semiconductor layer of each photo sensor is physically separated from the doped semiconductor layer of neighboring sensors. The substrate can be a CMOS substrate which includes image processing circuitry.

A first embodiment of this invention includes an active pixel sensor. The active pixel sensor includes a semiconductor substrate. An interconnect structure is adjacent to the substrate At least one photo sensor is adjacent to the interconnect structure. Each photo sensor includes a pixel electode which includes a patterned doped semiconductor layer. An I-layer is adjacent to the patterned doped semiconductor layer. A transparent electrode is formed adjacent to the I-layer.

A second embodiment of this invention is similar to the first embodiment. The second embodiment includes a patterned inner metal section adjacent to the patterned doped semiconductor layer.

A third embodiment of this invention is similar to the first embodiment. The third embodiment includes the doped semiconductor layer consisting of an N-layer.

A fourth embodiment of this invention is similar to the first embodiment. The fourth embodiment includes the I-layer and the doped semiconductor layer each being formed from amorphous silicon.

A fifth embodiment of this invention is similar to the first embodiment, but further includes a P-layer formed adjacent to the I-layer.

A sixth embodiment of this invention is similar to the fifth embodiment, but further includes the P-layer being formed from amorphous silicon.

A seventh embodiment of this invention includes a method of forming a photo diode active pixel sensor. The method includes forming an interconnect structure over a substrate. A doped semiconductor layer is deposited over the interconnect structure. The doped semiconductor layer is etched forming pixel electrodes. An I-layer is deposited over the pixel electrodes. Finally, a transparent conductive layer is deposited over the I-layer.

Other aspects and advantages of the present invention will become apparent from the following detailed description, taken in conjunction with the accompanying drawings, illustrating by way of example the principles of the invention.

DETAILED DESCRIPTION

Figure 1:
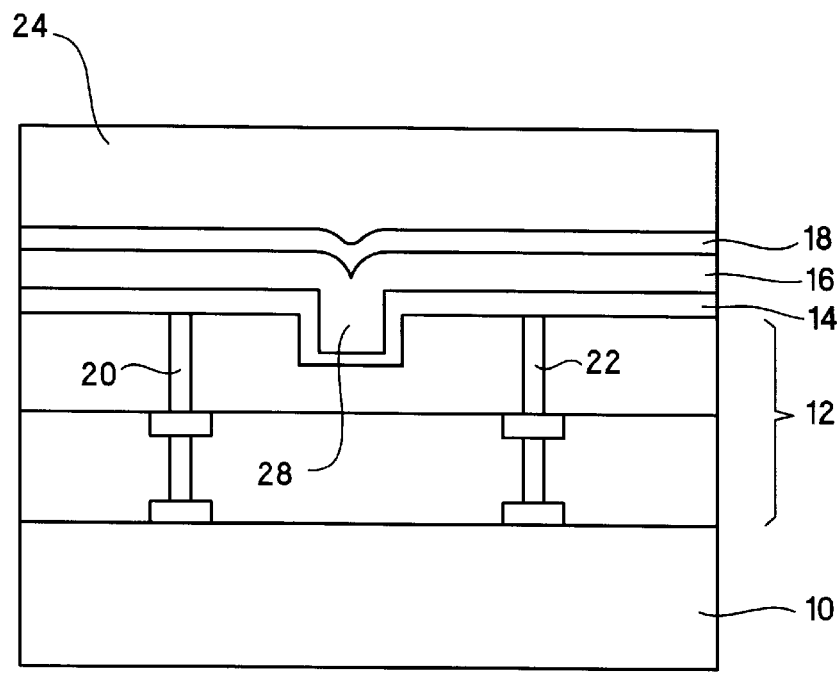
FIG. 1 shows a cross-section of a prior art array of photo sensors.

As shown in the drawings for purposes of illustration, the invention is embodied in an elevated active pixel sensor formed adjacent to a substrate which includes a plurality of photo sensors in which each photo sensor includes a separate patterned doped semiconductor layer. The patterned doped semiconductor layer of each photo sensor is physically separated from the doped semiconductor layer of neighboring sensors. The substrate can be a CMOS substrate which includes image processing circuitry.

Figure 2:
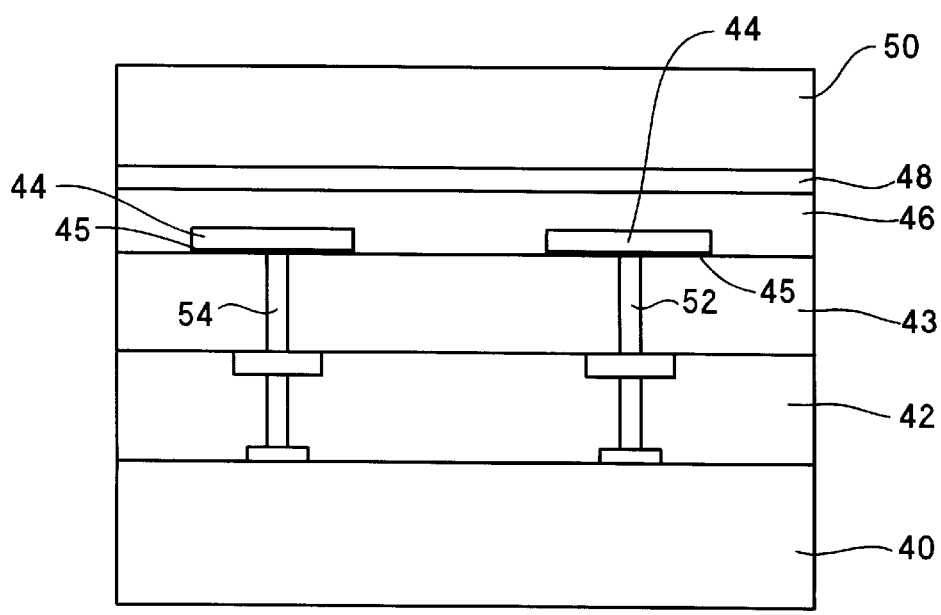
FIG. 2 shows an embodiment of the invention.

FIG. 2 shows a first embodiment of the invention. This embodiment includes a substrate 40. An interconnection structure 42 is formed adjacent to the substrate 40. A pixel interconnect structure 43 is formed adjacent to the interconnection structure 42. Pixel electrodes 44 and an inner metal section 45 are formed adjacent to the pixel interconnect structure 43. Each pixel sensor of an array of pixel sensors includes an individual patterned pixel electrode 44 and a inner metal section 45. An I-layer 46 is formed adjacent to the pixel electrodes 44. A P-layer 48 is formed adjacent to the I-layer 46. A transparent conductor 50 is formed adjacent to the P-layer 48. The pixel electrode 44 of a first pixel sensor is electrically connected to the substrate 40 through a first conductive via 52. The pixel electrode 44 of a second pixel sensor is electrically connected to the substrate 40 through a second conductive via 54.

The pixel sensors conduct charge when the pixel sensors receive light. The substrate 40 generally includes sense circuitry and signal processing circuitry. The sense circuitry senses how much charge the pixel sensors have conducted. The amount of charge conducted represents the intensity of light received by the pixel sensors. Generally, the substrate can be CMOS (complementary metal oxide silicon), BiCMOS or Bipolar. The substrate can include various types of substrate technology including charged coupled devices.

Typically, the interconnection structure 42 is a standard CMOS interconnection structure. The structure and methods of forming this interconnection structure are well known in the field of electronic integrated circuit fabrication. The interconnection structure 42 can be a subtractive metal structure, or a single or dual damascene structure.

The pixel interconnect structure 43 provides reliability and structural advantages to the elevated pixel sensor structure. The pixel interconnect structure allows for the formation of thin pixel electrodes 44 because the pixel electrodes 44 are formed over silicon rather that a metal pad located on the interconnection structure 42. The pixel interconnect structure 43 electrically connects the pixel electrodes 44 to the interconnection structure 42. The pixel interconnect structure 43 is typically formed from a silicon oxide or a silicon nitride.

The conductive vias 52, 54 pass through the pixel interconnect structure 43 and electrically connect the pixel electrodes 44 to the substrate 40. Typically, the conductive vias 52, 54 are formed from tungsten. Tungsten is generally used during fabrication because tungsten can fill high aspect ratio holes. That is, tungsten can be used to form narrow and relatively long interconnections. Typically, the conductive vias 52, 54 are formed using a chemical vapor deposition (CVD) process. Other materials which can be used to form the conductive vias 52, 54 include copper, aluminum or any other electrically conductive material.

There are several structural advantages to having the pixel interconnect structure 43 between the pixel electrodes 44 and the substrate 40. This structure allows the interconnection circuitry to be tightly packed. First of all, lateral space is conserve because the vias 52, 54 are located directly underneath the pixel electrodes. Secondly, the structure allows the formation of vias 52, 54 having a minimal diameter. CVD processes are generally the best method of forming the vias 52, 54. A Tungsten CVD process allows for the formation of small diameter vias. However, the temperatures required to form tungsten vias with a CVD process are greater than many of the materials (amorphous silicon for example) used to form the pixel electrodes can withstand. By forming the pixel interconnect structure 43 over the substrate 40, and the pixel electrodes 44 over the pixel interconnect structure 43, the vias 52, 54 can be formed before the pixel electrodes 44, and therefore, the pixel electrodes 44 are not subjected to the high temperatures required for the formation of the vias 52, 54.

The inner metal section 45 should include a thin conductive material. The inner metal section 45 may be formed, for example, from a degenerately doped semiconductor layer, aluminum, titanium, titanium nitride, copper or tungsten. The inner metal section 45 should be thin (approximately 500 Angstroms) and smooth. The inner metal section 45 should be smooth enough that any surface roughness is substantially less than the thickness of the pixel electrode 44 formed over the inner metal section 45. To satisfy the smoothness requirement, polishing of the inner metal section 45 may be required.

The inner metal section 45 can be optional. However, the inner metal section 45 has a lower resistance than the materials used to form the pixel electrodes 44. Therefore, the inner metal section 45 provides better current collection.

The pixel electrodes 44 are generally formed from a patterned doped semiconductor. The patterned doped semiconductor can be an N-layer of amorphous silicon. The pixel electrode must be thick enough, and doped heavily enough that the pixel electrodes 44 do not fully deplete when biased during operation. The pixel electrodes 44 are typically doped with phosphorous.

The pixel electrodes 44 are typically deposited using plasma enhanced chemical vapor deposition (PECVD). The PECVD is performed with a phosphorous containing gas. The phosphorous gas can be $PH_3$. A silicon containing gas is included when forming amorphous silicon pixel electrodes.

First an N-layer of amorphous silicon is deposited. Then a predetermined pixel electrode pattern (patterned doped semiconductor layer) is formed through a wet or dry etch of the deposited pixel electrode material. Because the pixel electrode material is etched after being deposited, the vacuum conditions in which the semiconductor substrate and partially formed active pixel sensor are subject to is broken. That is, the semiconductor substrate and partially formed active pixel sensor must be removed from vacuum conditions in order for the pixel electrode material to be etched. Generally, it is believed that breaking the vacuum conditions will result in impurities being introduced into the active pixel sensor formation process. However, for the purposes of this invention, breaking the vacuum conditions appears not to be a problem.

A patterned N-layer of amorphous silicon is typically used when forming PIN diode active pixel sensors. However, the diode active pixel sensors can include an NIP sensor configuration. In this case, the pixel electrodes 44 are formed from a patterned P-layer, and the P-layer 48 of FIG. 2 is replaced with an N-layer.

The I-layer 46 is generally formed from a hydrogenated amorphous silicon. The I-layer 46 can be deposited using a PECVD or reactive sputtering process. The PECVD process must include a silicon containing gas. The deposition should be at a low enough temperature that hydrogen is retained within the film. The I-layer 46 is approximately one micron thick.

The invention includes the I-layer 46 being electrically connected to the transparent conductor 50. The I-layer includes a resistive path between the electrodes 44 and the transparent conductor 50. An edge electrode (the electrode 44 electrically connected to the conductive via 54) should be located so that a distance 47 between edge of the electrode and the transparent conductor 50 is maximized. The resistance of the resistive path between the edge electrode and the transparent conductor 50 is directly dependent on the distance 47. Increasing the resistance minimizes leakage current which flows through the resistive path.

The P-layer 48 is generally formed from amorphous silicon. Typically, the P-layer 48 is doped with Boron. The P-layer 48 can deposited using PECVD. The PECVD is performed with a Boron containing gas. The Boron containing gas can be $B_2H_6$. A silicon containing gas is included when forming an amorphous silicon P-layer 48. The P-layer 48 thickness must generally be controlled to ensure that the P-layer 48 does not absorb too much short wavelength (blue) light.

Another embodiment of the invention does not include a P-layer 48. The P-layer can be eliminated with proper selection of the composition of material within the transparent conductor 50, and proper selection of the doping levels of the pixel electrodes 44.

As previously described, the pixel electrodes 44, the I-layer 46 and the P-layer 48 are generally formed from amorphous silicon. However, the pixel electrodes 44, the I-layer 46 and the P-layer 48 can also be formed from amorphous carbon, amorphous silicon carbide, amorphous germanium, or amorphous silicon-germanium. It should be understood that this list is not exhaustive.

The transparent conductor 50 allows for biasing of the P-layer 48 of the pixel sensors. Light must pass through the transparent conductor 50 which is received by the pixel sensors. Generally, the transparent conductor 50 is formed from an indium tin oxide. However, the transparent conductor 50 can also be formed from titanium nitride, thin silicide, or certain types of transition metal nitrides or oxides.

Both the selection of the type of material to be used within the transparent conductor 50, and the determination of the desired thickness of the transparent conductor 50, are based upon minimizing the optical reflection of light received by the pixel sensor. Minimization of the reflection of light received by the pixel sensor helps to optimize the amount of light detected by the pixel sensor.

The transparent conductor 50 can be deposited by a sputtering process. Deposition through sputtering is well known in the art of integrated circuit fabrication.

A protective layer may be formed over the transparent conductor 50. The protective layer provides mechanical protection, electrical insulation, and can provide some anti-reflective characteristics.

Another embodiment includes Schottky diode sensors. Schottky diode sensors include several different configurations. A first Schottky diode configuration includes the electrodes 44 being formed from a conductive metal. This configuration also includes the I-layer 46 and the P-layer 48. A second Schottky diode configuration includes the electrodes 44 being formed from a conductive metal and the P-layer 48 being replaced with a transparent conductive layer or a transparent silicide. A third Schottky diode configuration includes the electrodes 44 being formed from an N-layer, and the P-layer being replaced with a transparent conductive layer. The transparent conductive layer of the third configuration must exhibit a proper work function. Conductive metals which may be used for the Schottky configurations include chrome, platinum, aluminum and titanium.

FIGS. 3–7 show processing steps which can be used to fabricate the embodiment shown in FIG. 2.

Figure 3:
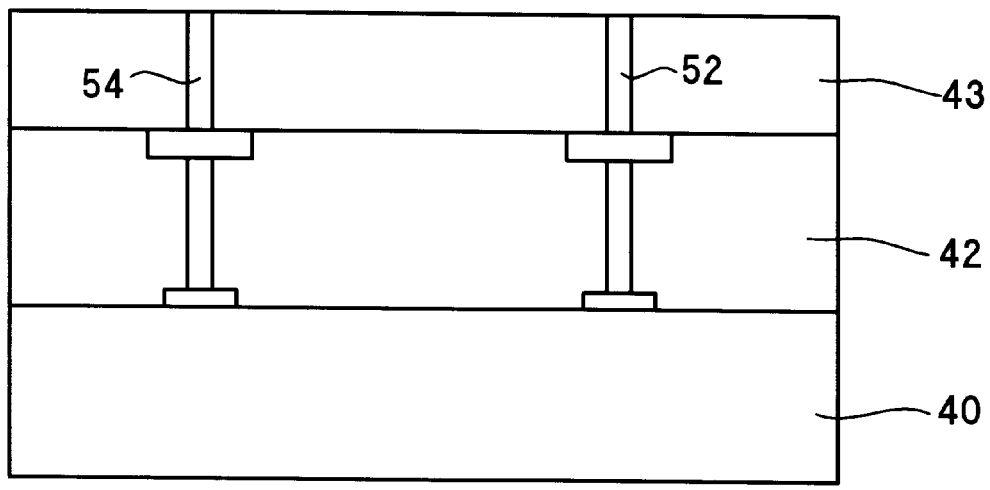
FIG. 3 shows a substrate with a standard interconnection structure and a pixel interconnect formed over a substrate.

FIG. 3 shows a substrate 40 with a standard interconnection structure 42 and a pixel interconnect structure 43 formed over the substrate 40. The structure and methods of forming this interconnection structure 42 are well known in the field of electronic integrated circuit fabrication. The interconnection structure 42 can be a subtractive metal structure, or a single or dual damascene structure. The pixel interconnect structure 42 is typically formed from a silicon oxide or a silicon nitride.

The pixel interconnect structure 43 includes pixel vias 52, 54. Generally, the conductive vias 52, 54 are formed from tungsten. Tungsten is generally used because during fabrication, tungsten can fill high aspect ratio holes. That is, tungsten can be used to form narrow and relatively long interconnections. Typically, the conductive vias 52, 54 are formed using a chemical vapor deposition (CVD) process. Other materials which can be used to form the conductive vias 52, 54 include copper, aluminum or any other electrically conductive material.

Figure 4:
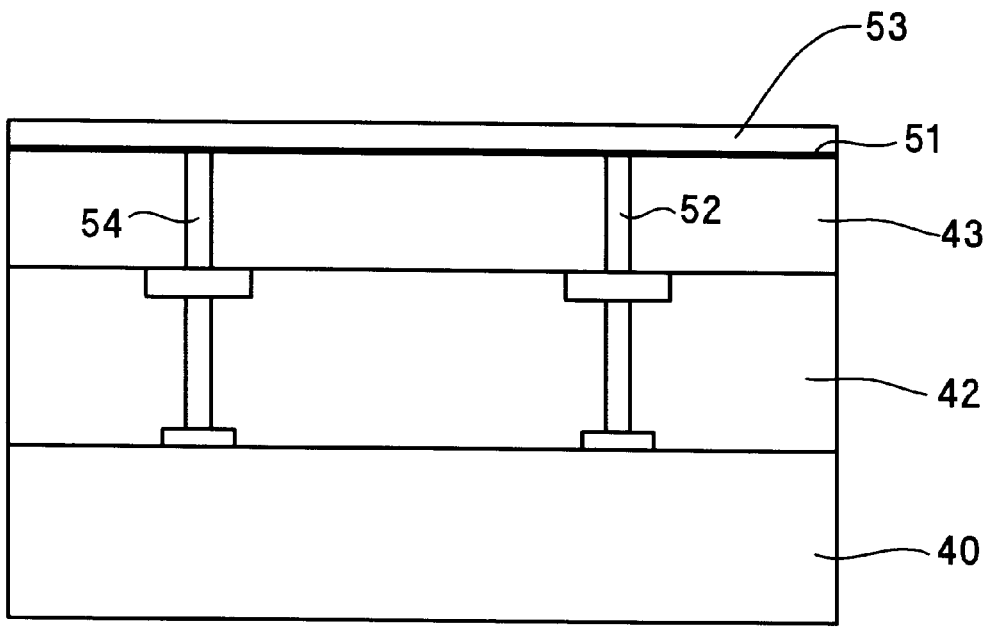
FIG. 4 shows a pixel electrode layer and an inner metal layer deposited over the pixel interconnect structure.

FIG. 4 shows a pixel electrode layer 53 and an inner metal layer 51 deposited over the pixel interconnect structure 43. The pixel electrode layer 53 is typically deposited using PECVD. The PECVD is performed with a phosphorous containing gas. The phosphorous containing gas can be $PH_3$. A silicon containing gas, such as $Si_2H_6$ or $SiH_4$, is included when forming amorphous silicon pixel electrodes 44. The inner metal layer 51 is typically deposited by a sputtering process.

Figure 5:
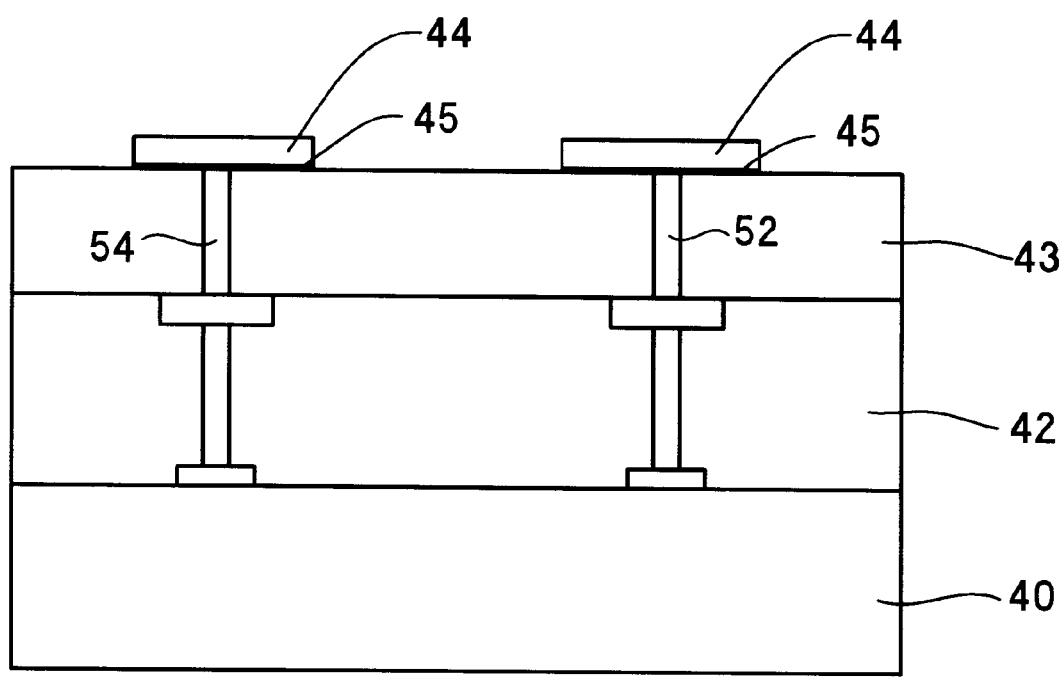
FIG. 5 shows the pixel electrode layer and an inner metal layer wet or dry etched according to a predetermined pattern forming the pixel electrodes and inner metal sections.

FIG. 5 shows the pixel electrode layer 53 and an inner metal layer 51 wet or dry etched according to a predetermined pattern forming the pixel electrodes 44 and the inner metal sections 45. An individual pixel electrode 44 and inner metal section 45 are formed for each pixel sensor.

The pixel electrodes 44 can be formed with a patterned doped semiconductor layer, like, N-layer sections. Alternatively, the pixel electrodes 44 can be implemented with a conductive nitride, like, titanium nitride.

Figure 6:
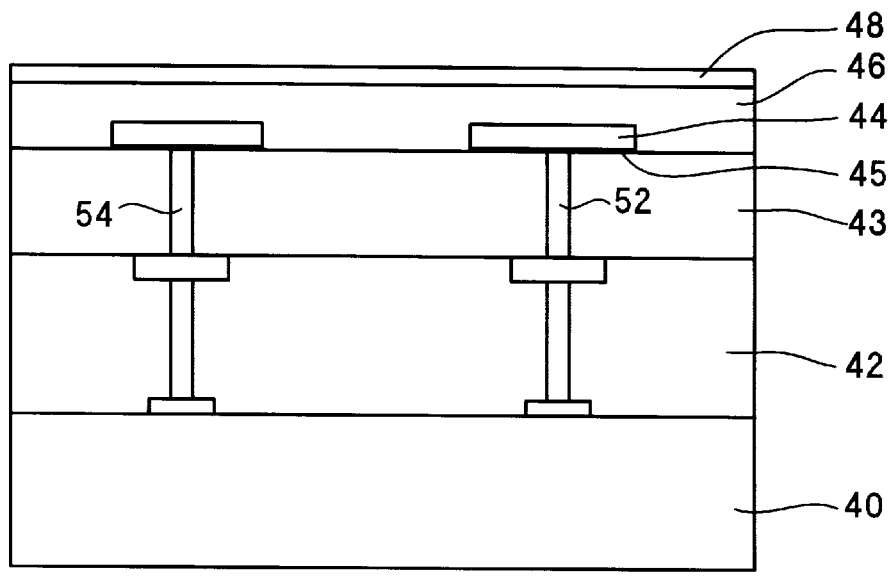
FIG. 6 shows an I-layer and a P-layer deposited over the plurality of pixel electrodes.

FIG. 6 shows an I-layer 46 and a P-layer 48 deposited over the plurality of pixel electrodes 44. The I-layer 46 is generally deposited using a PECVD or reactive sputtering process. The PECVD must include a silicon containing gas. The deposition should be at a low enough temperature that hydrogen is retained within the film. The P-layer 48 can also be deposited using PECVD. The PECVD is performed with a Boron containing gas. The Boron containing gas can be $B_2H_6$. A silicon containing gas is included when forming an amorphous silicon P-layer 48.

Figure 7:
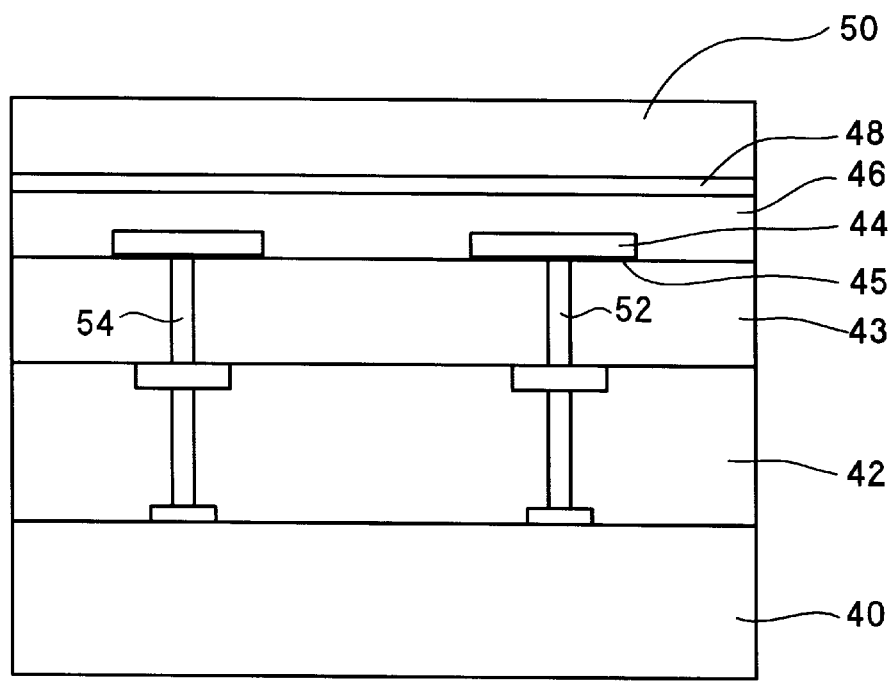
FIG. 7 shows the transparent conductive layer deposited over the P-layer which provides the capability of electrical connecting the P-layer to a bias voltage.

FIG. 7 shows the transparent conductive layer 50 deposited over the P-layer 48 which provides the capability of electrical connecting the P-layer 48 to a bias voltage. Generally, the transparent conductor 50 is formed from an indium tin oxide. However, the transparent conductor 50 can also be formed from titanium nitride, thin silicide, or certain types of transition metal nitrides or oxides.

The transparent conductive layer 50 is generally deposited through reactive sputtering. However, the transparent conductive layer 50 can also be grown by evaporation. If the transparent conductive layer 50 is formed from titanium nitride, then typically a CVD process must be used to deposit the transparent conductive layer 50.

Although specific embodiments of the invention have been described and illustrated, the invention is not to be limited to the specific forms or arrangements of parts so described and illustrated. The invention is limited only by the claims.

What is claimed:

1. An active pixel sensor comprising:
   a semiconductor substrate;
   an interconnect structure adjacent to the substrate the interconnect structure comprising conductive vias;
   at least one photo sensor adjacent to the interconnect structure, each photo sensor comprising:
      a patterned conductive material formed adjacent to the interconnect structure, the patterned conductive material physically connected to at least one conductive via of the interconnect structure;
      a pixel electrode comprising a patterned doped semiconductor layer;
      an I-layer adjacent to the patterned doped semiconductor layer; and
      a transparent electrode formed adjacent to the I-layer.

2. The active pixel sensor as recited in claim 1, wherein the semiconductor layer comprises an N-layer.

3. The photo diode active pixel sensor as recited in claim 1, wherein the I-layer and the doped semiconductor layer each comprise amorphous silicon.

4. The photo diode active pixel sensor as recited in claim 1, further comprising a P-layer formed adjacent to the I-layer.

5. The photo diode active pixel sensor as recited in claim 4, wherein the P-layer comprises amorphous silicon.

6. The photo diode active pixel sensor as recited in claim 1, wherein the transparent electrode comprises indium tin oxide.

7. The photo diode active pixel sensor as recited in claim 1, wherein the substrate comprises CMOS.

8. The photo diode active pixel sensor as recited in claim 1, wherein the substrate comprises active circuits which sense charge conducted by the photo sensors due to the photo sensors receiving light.

9. The photo diode active pixel sensor as recited in claim 1, wherein the substrate comprises charge coupled devices.

10. The active pixel sensor as recited in claim 1, wherein the doped semiconductor layer comprises a P-layer.

11. The photo diode active pixel sensor as recited in claim 10, further comprising an N-layer formed adjacent to the I-layer.

* * * * *